(12) United States Patent
London

(10) Patent No.: US 8,004,120 B2
(45) Date of Patent: Aug. 23, 2011

(54) HIGH POWER BIPOLAR PULSE GENERATORS

(75) Inventor: Simon London, Rockville, MD (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 103 days.

(21) Appl. No.: 12/404,061

(22) Filed: Mar. 13, 2009

(65) Prior Publication Data

US 2010/0231278 A1    Sep. 16, 2010

(51) Int. Cl.
    *H03K 3/00* (2006.01)
(52) U.S. Cl. .................................................. 307/106
(58) Field of Classification Search .............. 307/106
    See application file for complete search history.

(56) References Cited

U.S. PATENT DOCUMENTS

| | | | |
|---|---|---|---|
| 2,769,101 A | 10/1956 | Drosd | |
| 5,138,270 A * | 8/1992 | Nakata et al. | 327/179 |
| 6,214,297 B1 | 4/2001 | Zhang et al. | |
| 7,884,504 B2 * | 2/2011 | Tao et al. | 307/106 |
| 2005/0174715 A1 | 8/2005 | Yampolsky | |
| 2006/0269531 A1 | 11/2006 | Beebe et al. | |
| 2007/0165839 A1 | 7/2007 | London | |

FOREIGN PATENT DOCUMENTS

| | | |
|---|---|---|
| SU | 1254994 A1 | 9/1994 |
| SU | 1098502 A1 | 9/1996 |

OTHER PUBLICATIONS

Specification and drawings of unpublished related co-pending U.S. Appl. No. 12/404,101, filed Mar. 13, 2009; "Bipolar Pulse Generators with Voltage Multiplication and Pulse Separation"; Simon Y. London.; pp. 1-27, drawings pp. 1-14.
"Modeling of Wound Coaxial Blumlein Pulsers", by Jose O. Rossi et al:, published in IEEE Transactions on Plasma Science, vol. 34, No. 5, Oct. 2006. Cited in spec.
"Design of a 150kV ,300A, 100Hz Blumlein Coaxial Pulser for Long Pulse Operation",by J.O. Rossi et al., presented in IEEE Transactions on Plasma Science, vol. 30, No. 5, Oct. 2002. Cited in spec.
"A Combined High-Voltage, High-Energy Pulse Generator", by S.J. Macgregor et al. published in "Meas. Sci. Technol" 5 (1994), pp. 1580-1582. Cited in spec.

(Continued)

*Primary Examiner* — Jared J Fureman
*Assistant Examiner* — Adi Amrany
(74) *Attorney, Agent, or Firm* — Rossi, Kimms & McDowell; Marc A. Rossi; Daniel J. Long

(57) ABSTRACT

A bipolar pulse generator is implemented in a simple structure while providing a high efficiency design having a relatively low total size, while still allowing access by fibers used to control a photoconductive switch that activates the generator. The bipolar pulse generator includes a stacked Blumlein generator structure with an additional transmission line connected to a load at its near end and short-circuited at its distal end. An extra transmission line is positioned between the Blumlein generator's structure and the load provides specified limited gap between positive and negative sub-pulses. The bipolar pulse generator further includes a bended Blumlein generator structure, in which an existing intrinsic "stray" transmission line is used to provide the bipolar pulse. Still further, bipolar pulse generator includes stepped transmission lines, with additional switches positioned between steps, which are charged by different voltages.

2 Claims, 13 Drawing Sheets

OTHER PUBLICATIONS

"A Novel HV Double Pulse Modulator", by S.J. Macgregor et al., published in "Meas. Sci. Technol" 5(1994), pp. 1407-1408. Cited in spec.

"A PFN Marx Generator Based on High-Voltage Transmission Lines", by S.M.Turnball et al., presented in Meas. Sci. Technol.11 (2000) N51-N55. Cited in spec.

"Design of Bipolar Pulse Generator for Ferroelectric Electron Emission Extraction", Feng Chen et al., Pulsed Power IEE Symposium, 2000. Cited in spec. in unpublished related co-pending U.S. Appl. No. 12/404,101, filed Mar. 13, 2009.

* cited by examiner

| N steps | $Z_{N-1}$ | $Z_N$ | $Z_C$ | $Z_L$ | $Z_R$ |
|---|---|---|---|---|---|
| 1 | - | 3 | 1 | 4 | 2 |
| 3 | 7/3 | 17.5/3 | 2.5 | 50/3 | 50/9 |
| 5 | 20/3 | 44/3 | 5.5 | 60.5 | 121/8 |
| 7 | 88/5 | 168/5 | 10.5 | 882/5 | 882/25 |
| 9 | 399/10 | 342/5 | 18 | 432 | 72 |
| 11 | 558/7 | 883.5/7 | 28.5 | 6498/7 | 6498/49 |
| 13 | 1011.75/7 | 1508.75/7 | 42.5 | 7225/4 | 7225/32 |
| 15 | 4377.5/18 | 6231.5/18 | 60.5 | 58564/18 | 58564/162 |
| 17 | 6945.4/18 | 9528.4/18 | 83 | 27556/5 | 27556/50 |
| 19 | 6424.2/11 | 8552.7/11 | 110.5 | 97682/11 | 97682/121 |

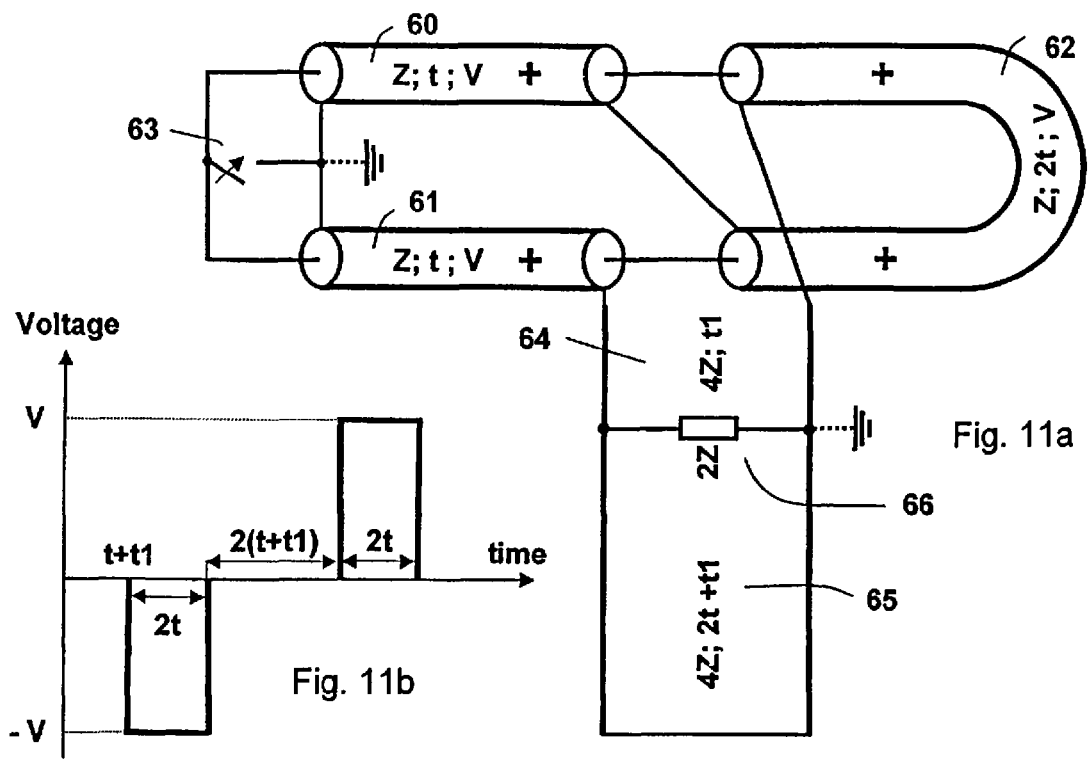
Fig. 11a
Fig. 11b
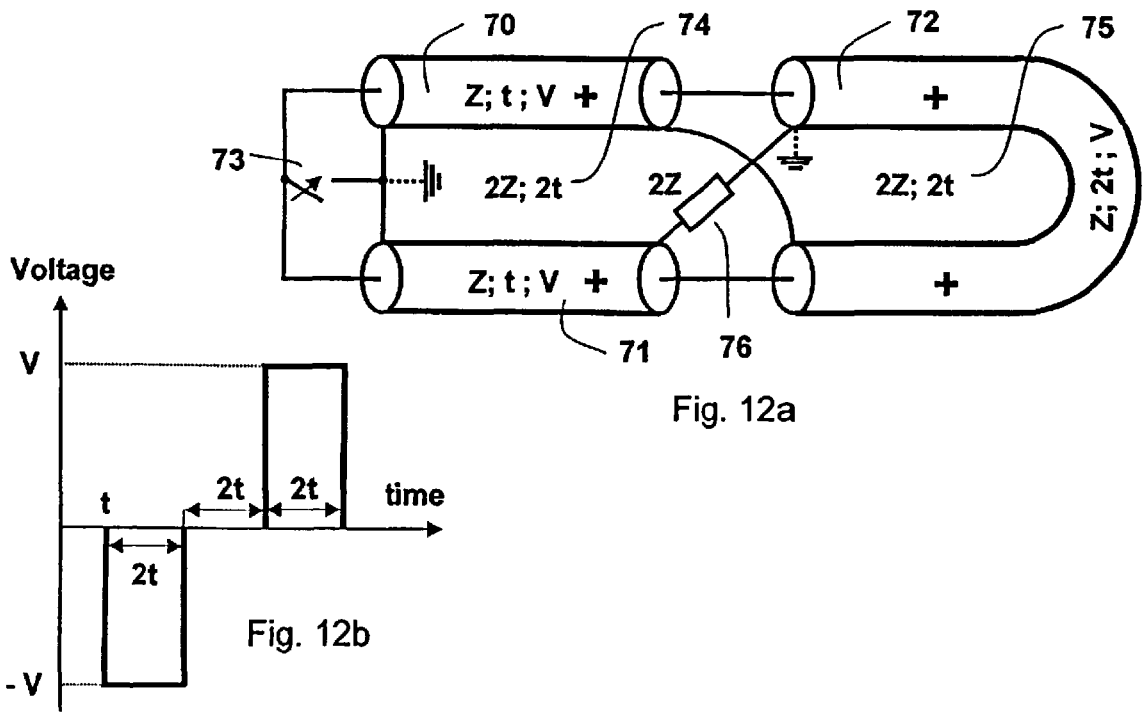
Fig. 12a
Fig. 12b

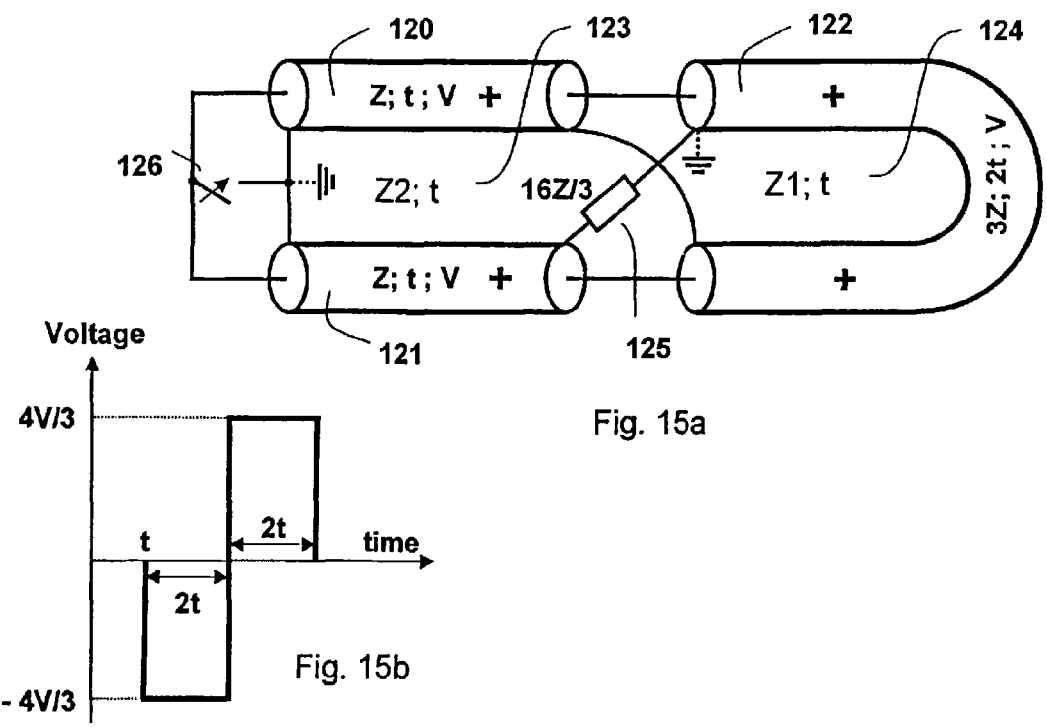
Fig. 15a
Fig. 15b
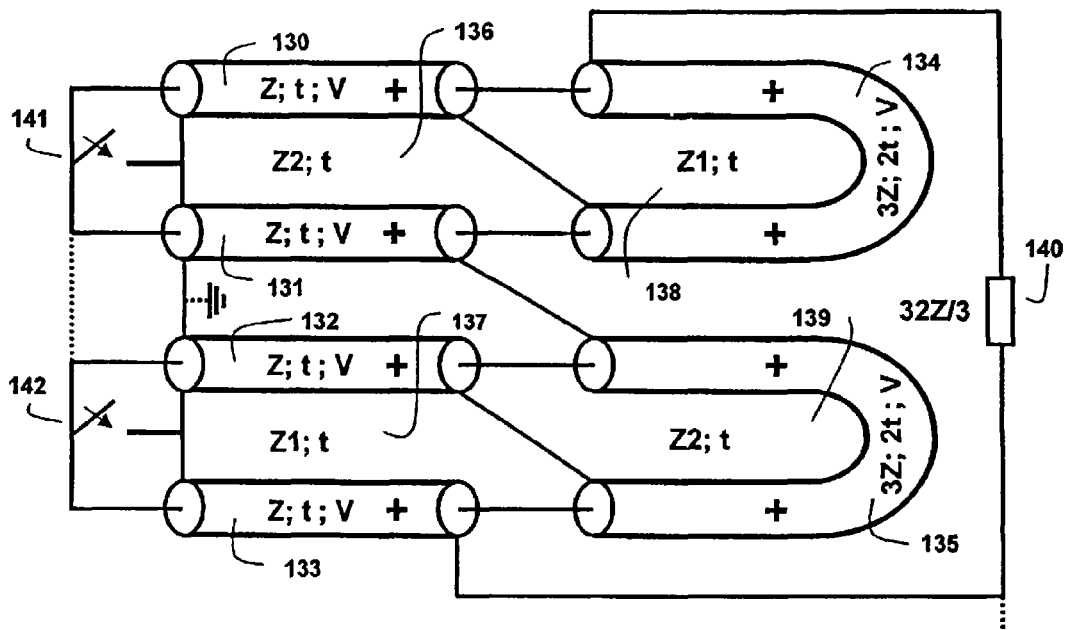
Fig. 16

| # Steps | $Z_{N-1}$ | $Z_N$ | $Z_C$ | $Z_L$ | $Z_R$ |
|---|---|---|---|---|---|
| 3 | 2.2 | 8.8 | 6.5 | 30 | 10 |
| 5 | 13 | 32 | 17 | 150 | 37 |
| 7 | 46 | 100 | 36 | 555 | 110 |
| 9 | 130 | 230 | 66 | 1500 | 247 |
| 11 | 280 | 450 | 106 | 3370 | 477 |
| 13 | 520 | 790 | 160 | 6700 | 830 |
| 15 | 900 | 1300 | 230 | 12260 | 1350 |
| 17 | 1450 | 2000 | 316 | 20900 | 2080 |
| 19 | 2200 | 2950 | 420 | 33900 | 3060 |
| 21 | 3230 | 4200 | 550 | 52500 | 4350 |
| 23 | 4570 | 5820 | 700 | 78500 | 6000 |

HIGH POWER BIPOLAR PULSE GENERATORS

BACKGROUND

The present invention relates in general to pulse generators. More specifically, the present invention relates to bipolar pulse generators that provide a high power/energy pulse on a load.

Recent trends in the development of pulse power microwave sources for a variety of applications have been directed to increasing power, efficiency and energy on the load. Transmission line pulse generators with different kinds of fast switches, including light activated photoconductors, can achieve some of the best results in generating high power short duration pulses. For a given limited charging voltage of transmission lines defined by high-current switches, high powered and high energy density transmission lines imply low characteristic impedances. This low range of characteristic impedances, however, frequently causes problems for coupling with typically used load impedances, 50 ohm or higher, for example, radiating impedances, which introduces a problem with efficient high ratio impedance transformation.

Bipolar pulse generators very often have significant advantages compared to unipolar pulse generators, with just one example being UWB radiation. Further, there are many potential applications of bipolar pulse generators, for example in industry, physics and medicine, where very often bipolar pulse generators with time separation between positive and negative sub-pulses are preferable or required. Today, however, there are only various types of high power and high energy unipolar pulse generators (Marx generator and stacked Blumlein generator in various modifications).

For example, a high energy Marx generator with coaxial cable to provide rectangular unipolar pulse is known and described in "A PFN Marx Generator Based on High-Voltage Transmission Lines", by S. M. Turnbull et al. presented in Meas. Sci. Technol. 11 (2000) N51-N55. Further, a stacked Blumlein generator with a single switch has been proposed in U.S. Pat. No. 2,769,101 issued to R. D. Drosd. This type of generator has been designed and presented in various publications including, for example, "Modeling of Wound Coaxial Blumlein Pulsers", by Jose O. Rossi et al:, published in IEEE Transactions on Plasma Science", Vol. 34, No. 5, October 2006, "Design of a 150 kV, 300A, 100 Hz Blumlein Coaxial Pulser for Long Pulse Operation", presented in IEEE Transactions on Plasma Science", Vol. 30, No. 5, October 2002. Still further, some modifications of stacked (cascade) Blumlein generators are presented in "A Combined High-Voltage, High-Energy Pulse Generator", by S. J. MacGregor et al. published in "Meas. Sci. Technol" 5 (1994), pp. 1580-1582, and "A Novel HV Double Pulse Modulator", published in "Meas. Sci. Technol" 5 (1994), pp. 1407-1408. Finally, another type of high-power generator, namely, a "Multi-Stage Blumlein" is proposed by J. Yampolsky in U.S. Patent Application 2005/0174715 A1, 2005. The content of each of the above-reference documents is incorporated herein by reference. All of the above-referenced generators produce only a unipolar pulse and do not provide voltage (impedance) transformation, with the exception of the proposed multi-stage Blumlein disclosed in U.S. Patent Application 2005/0174715A1, which provides moderate transformation but requires a substantial number of switching devices.

A transmission line "High-Voltage Pulses Generator" has also been described in U.S. Pat. No. 1,098,502 A1 issued to Bosamykin V. S. et al, 1996, which provides bipolar pulse by a single switch. However, the power/energy on load is much less compared to that provided by the above-mentioned unipolar generators. In addition, impedance transformation in the device is low.

The applicant has also previously described a transmission line in U.S. Patent Application 2007/0165839 A1 entitled "Bipolar Pulse Generators With Voltage Multiplication", which provides a device with a single switch with all of the required voltage/impedance transformation. However, in a stacked configuration with several switches, the energy provided by this type of generator is less compared to the above mentioned Blumlein-based stacked unipolar generators with less number of switches.

Accordingly, there remains a need for a bipolar pulse generator solution based on voltage charged transmission lines, which provides high power and high energy. Further, there remains a need for high power/energy bipolar pulse generator, which can provide voltage/impedance transformation. Still further, there remains a need for a high power/energy bipolar pulse generator with pulse separation between positive and negative sub-pulses.

It would be desirable to provide a bipolar pulse generator that could meet all of the above needs while being implemented in a simple structure, preferably with a single switch, and preferably in a high efficiency design that has a relatively low total size, while still allowing simple access by fibers to a closing photoconductive switch that actuates the bipolar pulse generator.

SUMMARY OF THE INVENTION

The present invention provides a bipolar pulse generator that can be implemented in a simple structure while providing a high efficiency design having a relatively low total size and still allowing access by fibers used to control a photoconductive switch that activates the generator.

In a preferred embodiment of the invention, a bipolar pulse generator includes a stacked Blumlein generator structure with an additional transmission line connected to a load at its near end and short-circuited at its distal end. An extra transmission line is positioned between the Blumlein generator's structure and the load provides specified limited gap between positive and negative sub-pulses.

According to a further preferred embodiment of the present invention, the bipolar pulse generator further includes a bended Blumlein generator structure, in which an existing intrinsic "stray" transmission line is used to provide the bipolar pulse.

According to a still another embodiment of the present invention, the bipolar pulse generator consists of stepped transmission line with additional switches positioned between steps, which are charged by different voltages.

The bipolar pulse generator according to the invention generates high power/energy pulses in a compact design with access to fibers for activating photoconductor switches. Bipolar pulse generators according to the invention are useful for HPM generation, in particle accelerators and in other high voltage physical, industrial, medical and test instruments.

Other features, uses, advantages, embodiments, etc. of the invention will become apparent to those skilled in the art from the following detailed description of the preferred embodiments of the invention.

BRIEF DESCRIPTION OF THE DRAWINGS

The invention will be described with reference to certain preferred embodiments thereof along with the accompanying figures, wherein:

FIG. 7b depicts a pulse shape on the load of generator shown on FIG. 7a;

FIG. 8b depicts a pulse shape on the load of generator shown on FIG. 8a;

FIG. 11a depicts a schematic of a double Blumlein-based bipolar pulse generator according to an embodiment of the present invention;

FIG. 11b depicts a pulse form on the load for generator according to FIG. 11a;

FIG. 12a depicts a schematic of a double Blumlein-based bipolar pulse generator with their intrinsic transmission lines according to an embodiment of the present invention;

FIG. 12b depicts a pulse form on the load for generator according to FIG. 12a;

FIG. 15a depicts a schematic of double single-stage bipolar pulse generator with their intrinsic transmission lines that provides a bipolar pulse without a gap between sub-pulses according to an embodiment of the present invention;

FIG. 15b illustrates the pulse form on load for generator according to FIG. 15a;

FIG. 16 depicts a schematic of series connected two single-stage double bipolar pulse generators with their intrinsic transmission lines according to an embodiment of the present invention;

FIG. 18b illustrates the pulse form on the load provided by the generator according to FIG. 18a;

DETAILED DESCRIPTION OF THE PREFERRED EMBODIMENTS

Figure 1:
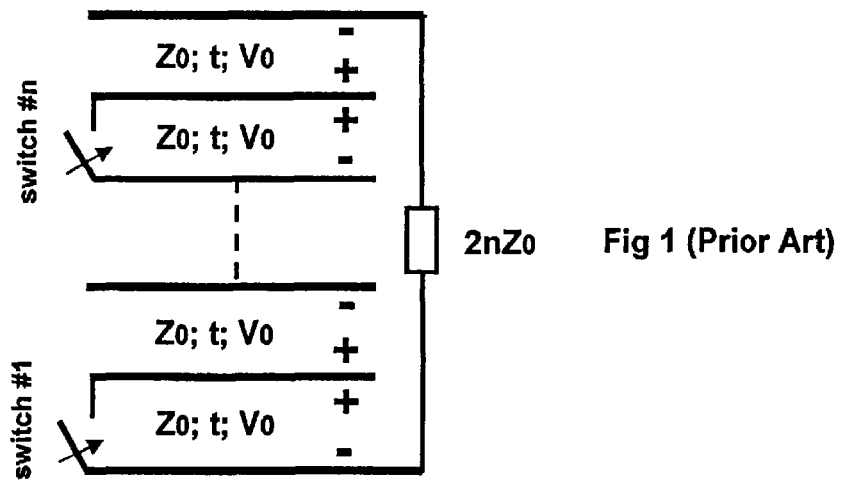
FIG. 1 depicts a schematic of classic n-stacked Blumlein pulse generator according to the prior art.
Figure 2:
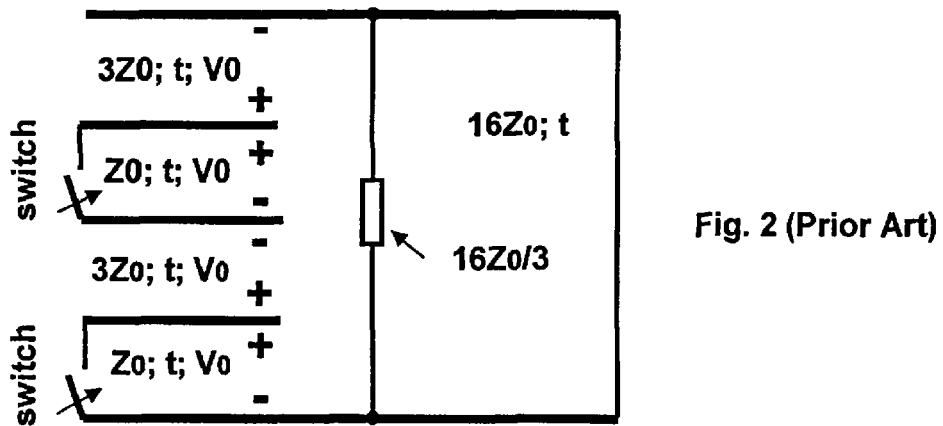
FIG. 2 depicts a schematic of double stacked bipolar pulse generator according to the prior art.
Figure 3:
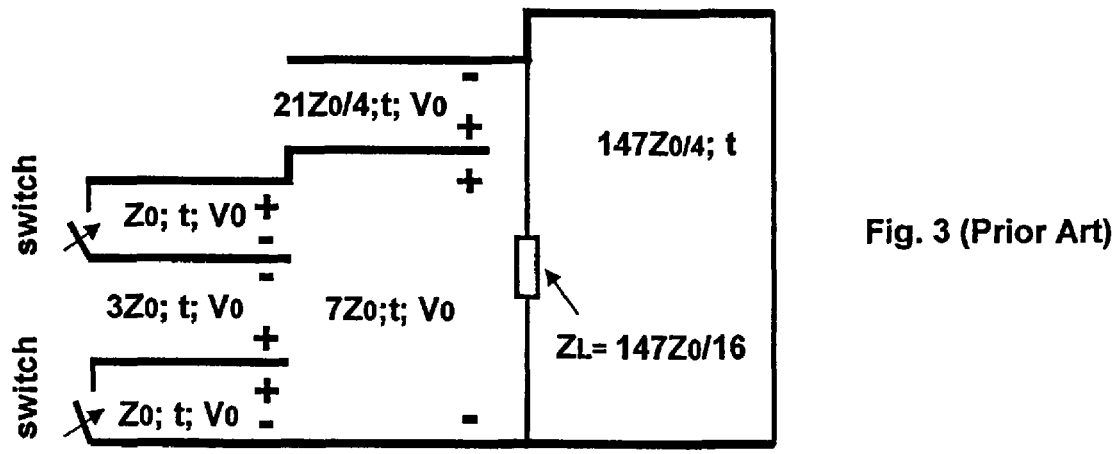
FIG. 3 depicts a schematic of two-step bipolar pulse generator as an expansion of the generator in FIG. 2 for impedance transformation according to the prior art.
Figure 4:
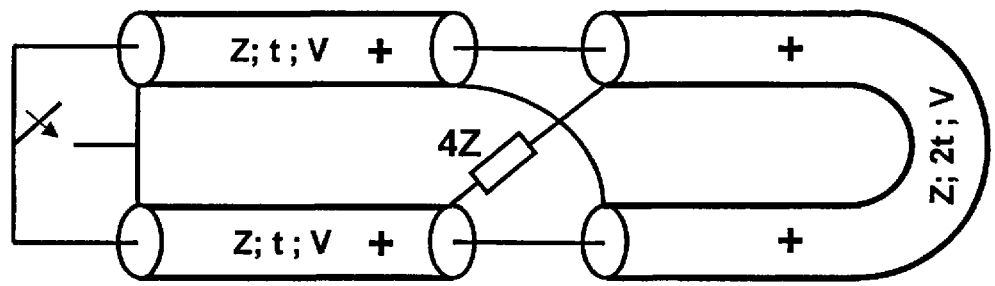
FIG. 4 depicts a schematic of double Blumlein pulse generator according to the prior art.
Figure 5:
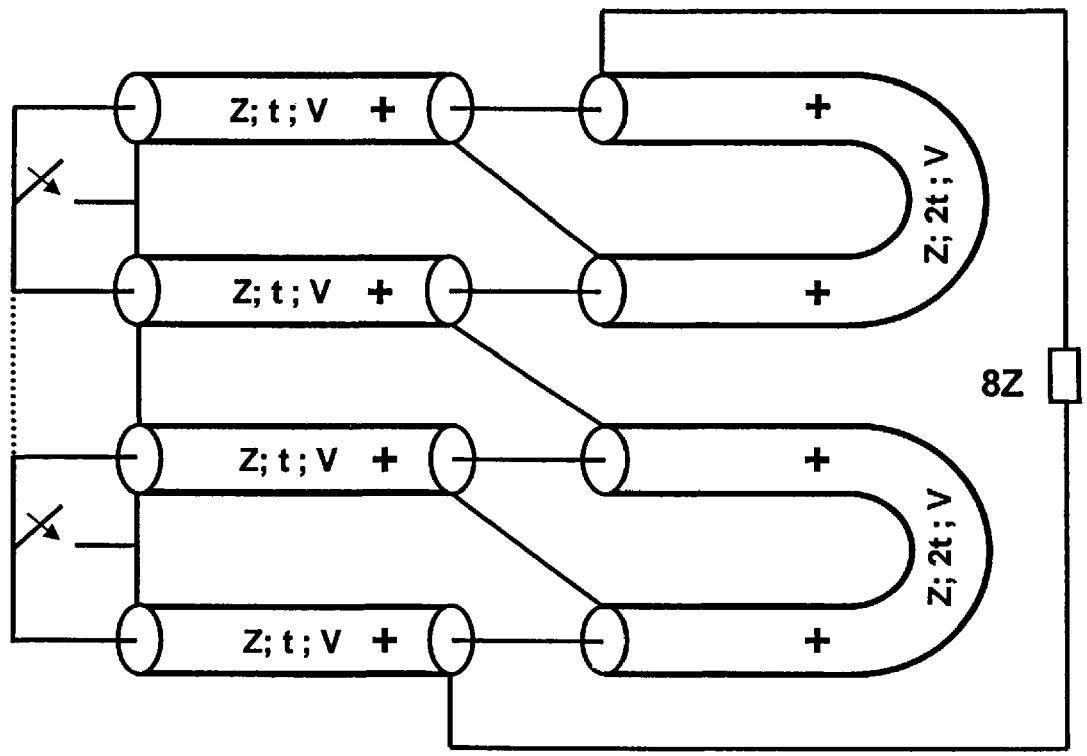
FIG. 5 depicts a schematic of two series connected double Blumlein pulse generators according to the prior art.
Figure 6:
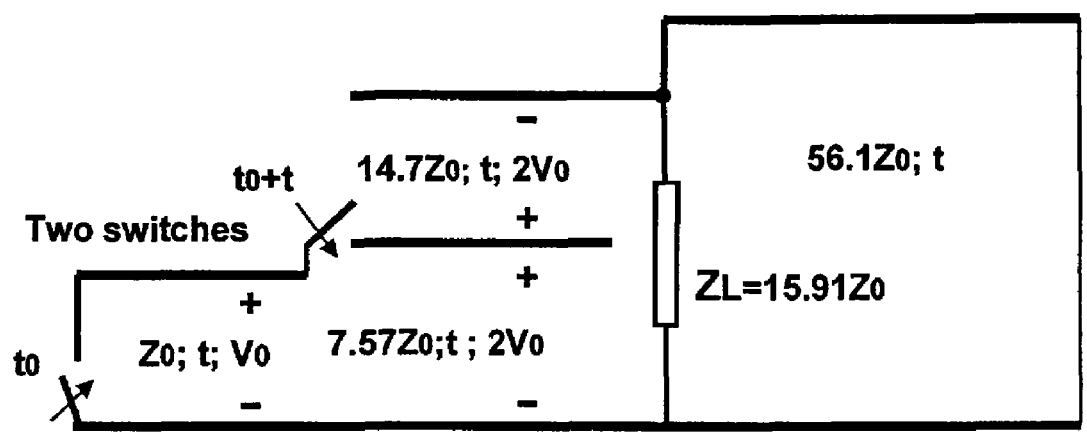
FIG. 6 depicts a schematic of bipolar pulse generator with two switches positioned in first two successive steps according to the prior art.

FIG. 1 depicts a well-known stacked Blumlein pulse Generator that provides a high-energy unipolar pulse on a matched load. FIG. 2 depicts a schematic of a prior art double stacked bipolar pulse generator of the type described in U.S. Patent Application 2007/0165839 A1. The stored energy and the energy on the load, however, is 75% of the energy provided by double stacked (n=2) unipolar generator presented on FIG. 1. FIG. 3 depicts a schematic of a prior art bipolar pulse generator, which is an extended type of generator shown in FIG. 2 with and additional impedance transformation step. FIG. 4 depicts a schematic of a prior art unipolar pulse generator, which is a double Blumlein pulse generator (with interconnected open-circuited charged transmission lines) presented by S. J. MacGregor et al. discussed above. FIG. 5 depicts a schematic of a prior art unipolar pulse generator, which is two series connected double Blumlein pulse generators (with interconnected open-circuited charged transmission lines) presented by S. J. MacGregor et al. discussed above. FIG. 6 depicts a schematic of a prior art bipolar pulse generator with two switches in first two successive steps presented in U.S. 2007/0165839 A1. The power/energy of the generating pulse is not a maximum that could be achieved in similar structure with two switches positioned in first two successive steps. The invention will be described in part with reference to prior art structures such as those discussed above.

Figure 7A:
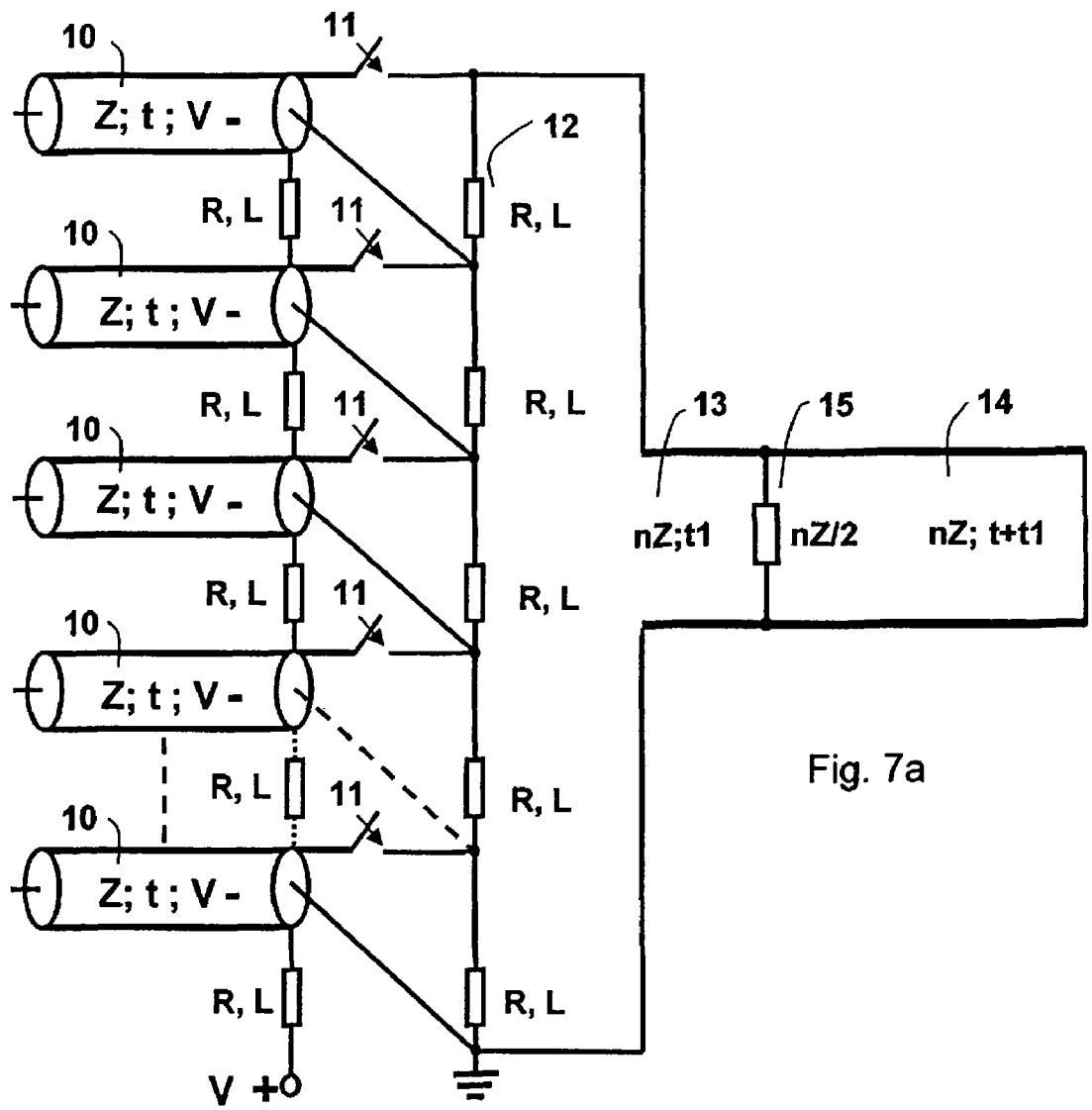
FIG. 7a depicts a schematic of transmission line Marx-based bipolar pulse generator according to an embodiment of the present invention.

FIG. 7a is a schematic of Marx-based transmission line bipolar pulse generator according to an embodiment of the present invention. The generator may consist of any number (n) of identically charged transmission lines 10. Each transmission line 10 is connected to a corresponding individual switch 11 and to a corresponding individual charging element 12 (resistor R or inductance L). Instead of typical direct connection to the load 15, the load 15 is connected through an additional transmission line 13 of a specified length. In addition, a transmission line 14 is connected to the load 15 at its near end and is short-circuited at its distal end. The electrical length of the transmission line 14 is equal to the sum of length of each charged line 10 and the length of line 13. The described arrangement provides a specified gap between positive and negative sub-pulses that is equal double the transit time of transmission line 13.

Figure 7B:
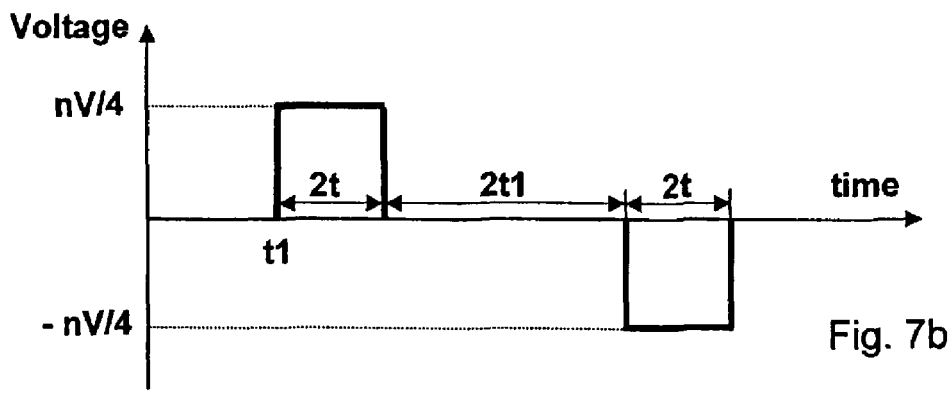

In operation, all of the charged transmission lines 10 are charged by their individual charging element 12. Once all the charged transmission lines 10 are fully charged, all of the switches 11 are closed at the same moment of time, thereby causing the charged transmission lines 10 to operate as n series connected generators. As a result, a bipolar pulse with a predicted time space or gap between positive and negative sub-pulses is realized on the load 15 as is illustrated in FIG. 7b.

Figure 8A:
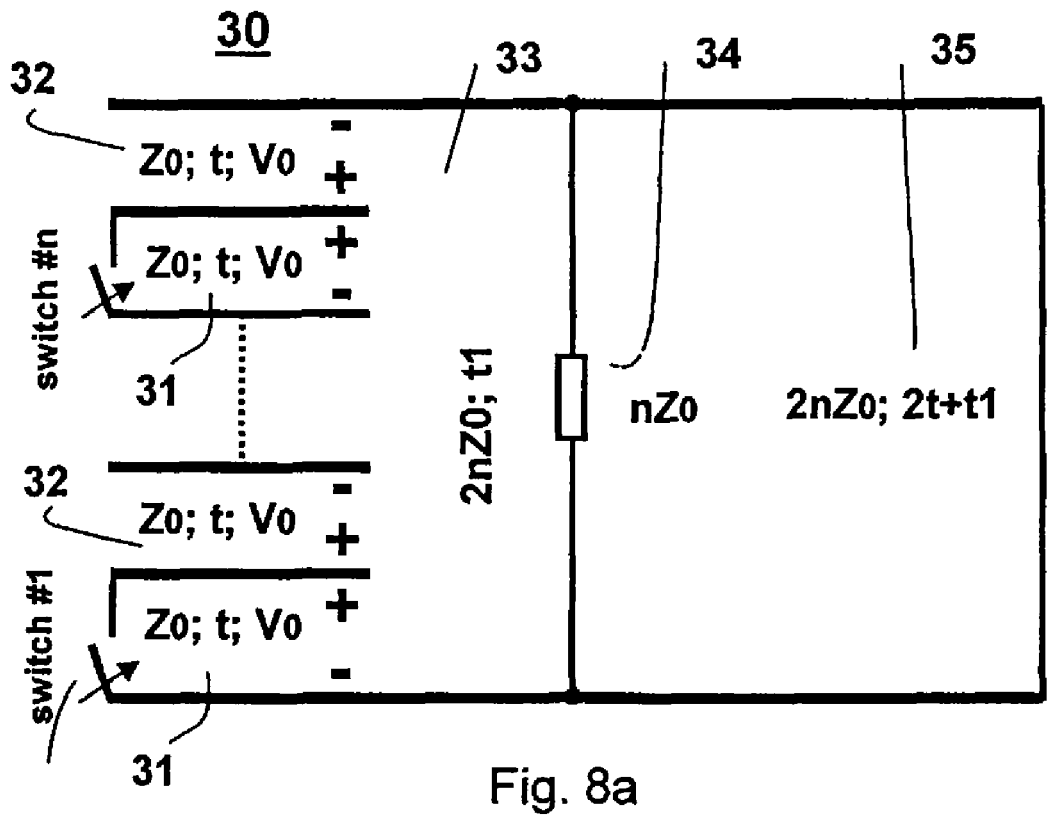
FIG. 8a depicts a schematic of an n-stacked Blumlein based bipolar pulse generator according to an embodiment of the present invention.

FIG. 8a is a schematic of a stacked Blumlein-based bipolar pulse generator according to an embodiment of the present invention. The generator consists of a charging structure 30 with any number n of identically first charged transmission lines 31 with switches at their near ends, and n oppositely charged second transmission lines 32 with the same length and characteristic impedances as for the first transmission lines 31. The output of this stacked Blumlein structure 30 is connected to the near end of an additional non-charged transmission line 33 with a specified electrical length t1 and characteristic impedance equal to $2nZ0$, where Z0 is a characteristic impedance of each charged first transmission lines 31 and the second transmission lines 32. The load 34 is connected to the distal end of the transmission line 33. In addition, another transmission line 35 is provided, which is connected to the load 34 at its near end and is short-circuited at its distal end. The load impedance is equal to nZ0, while the characteristic impedance of transmission line 35 is the same as for transmission line 33. The electrical length of the transmission line 35 is equal 2t +t1, where t is electrical length of each of the first transmission lines 31 and the second transmission lines 32.

Figure 8B:
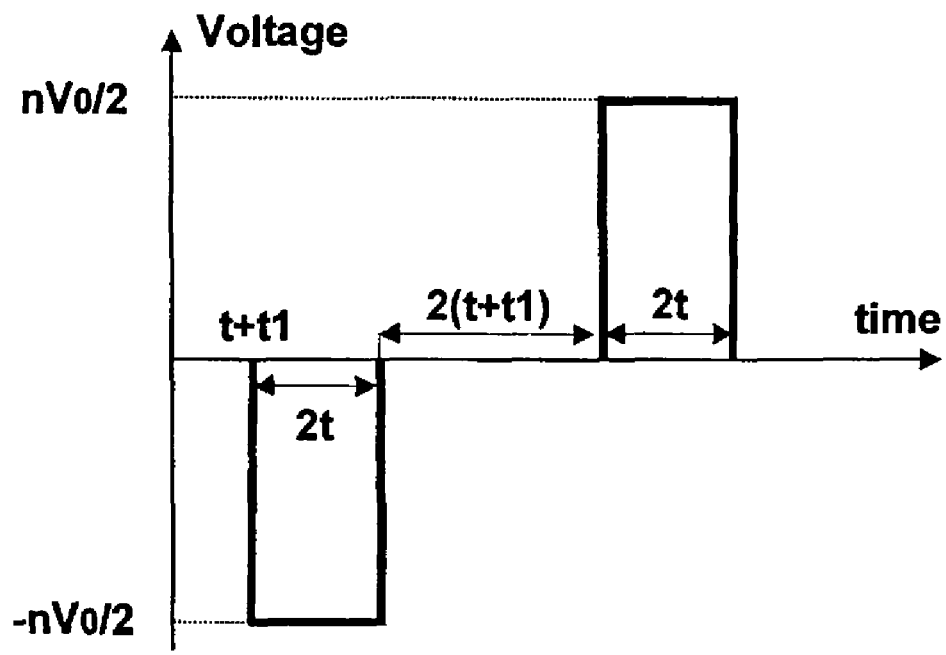

During operation, all the transmission lines 31 and the transmission lines 32 are charged by a voltage supply V0. All of the n switches are then closed simultaneously and a wave propagation process occurs. Identical waves propagate on all of the charged transmission lines 31 and the same is true for all of the charged transmission lines 32. The resulting pulse on the load is illustrated on FIG. 8b and minimum separation between sub-pulses is equal 2t.

Figures 9, 10:
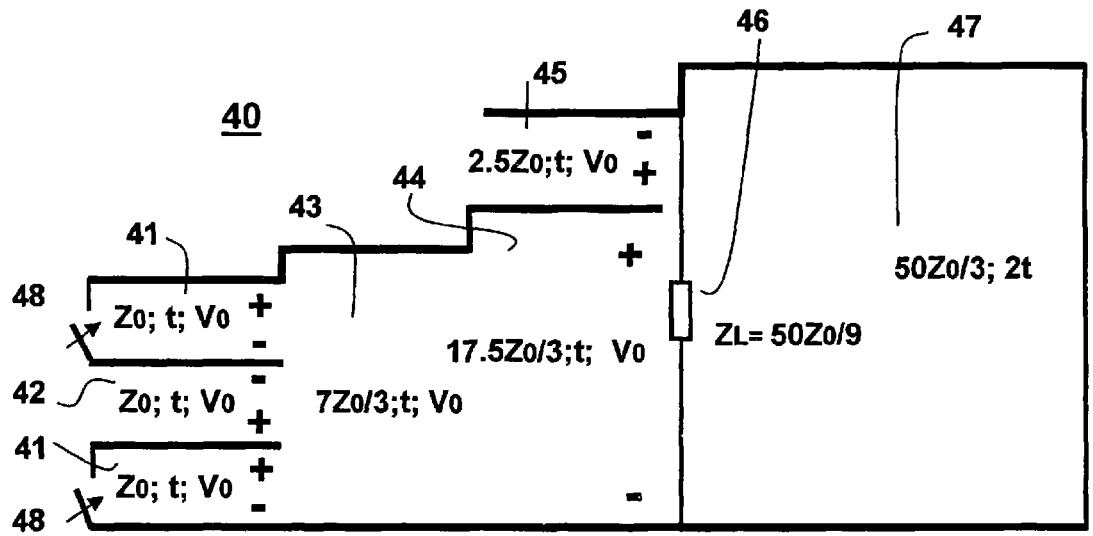
FIG. 9 depicts a schematic of a three-step, two-stacked Blumlein based bipolar pulse generator according to an embodiment of the present invention.
FIG. 10 depicts a table of normalized element's values of an N-step, two-stacked Blumlein-based bipolar pulse generators according to an embodiment of the present invention.

Referring to FIG. 9, a schematic of a three-step two stacked Blumlein based bipolar pulse generator according to an embodiment of the invention is illustrated. The generator starts from a generator according to FIG. 8a for particular case n=2 (transmission lines 41 and transmission lines 42) and t1=0. Extra step transmission lines 43 and 44 are provided as well as a transmission line 45 with specific characteristic impedances, obtained by impedance transformation procedure applied to initial circuit (FIG. 8a for n=2 and t1=0). This provides additional impedance/voltage transformation. The charged structure 40 of this generator consists of transmission lines 41, 42, 43, 44 and 45. Load 46 is positioned between charged transmission line structure 40 and a transmission line 47 that is connected to the load 46 and short-circuited at its distal end. The bipolar pulse is initiated by simultaneously closing two switches 48.

FIG. 10 is a table of normalized characteristic impedances of transmission lines as well as load impedances for odd numbers of steps 1, 3, 5 . . . 19. The table illustrates the rate of increasing impedance transformation by increasing the number of steps. The pulse form is independent on the number of steps. Only the magnitude of pulse is increased from step to step.

FIG. 11a is a schematic of a double Blumlein based bipolar pulse generator according to an embodiment of the present invention. This generator consists of a known double Blumlein unipolar pulse generator structure (transmission lines 60, 61, 62 and switch 63) with additional transmission lines 64 and 65. A transmission line 64 with time delay t1 is connected between the output of the double Blumlein unipolar pulse generator structure and a load 66. Transmission line 65 is connected to the load 66 at its near end and is short-circuited at its distal end. A characteristic impedance of the transmission lines 64, 65 is twice the impedance of the load 66 and four times more then the impedance of each of the transmission lines 60, 61 or 62. The electrical length of the transmission line 65 is twice the length of transmission lines 60 or 61 and is equal to the length of transmission line 62. Line 62 could also be separated in the middle by two identical length transmission lines without any change in operation and in pulse form on the load 66.

Ideal operation of this generator is similar to that for generator according to FIG. 8a when the number of switches equal two (n=2). The resulting pulse form on the load 66 is illustrated on FIG. 11b. The ideal operation of the generator according to FIG. 11a assumes that there are no inductances by outer conductors, or more correctly, no transmission lines associated by outer conductors of transmission lines 60 and 61, i.e. between nodes a1 and a2, as well as between nodes a1 and b1 by outer conductors of transmission line 62. However, between these nodes, there always exists intrinsic (stray) transmission lines short-circuited at their distant ends in practice. These transmission lines with specific characteristic impedances and electrical length could be used instead of transmission line 65 (or in addition to transmission line 65 with increased characteristic impedance) to provide a bipolar pulse. However, it is valid only for the case t1=0 and illustrated on FIG. 12a.

Referring to FIG. 12a, which is a schematic of double Blumlein-based Bipolar Pulse generator as an embodiment of the present invention. This generator consists of known double Blumlein unipolar pulse generator structure with transmission lines 70, 71, 72 and switch 73. This structure is similar to the structure with transmission lines 60, 61, 62 and switch 63 of FIG. 11a. However, instead of using transmission line 65 with time delay 2t (t1=0), which is short-circuited at its distal end, there are two intrinsic transmission lines 74 and 75 formed by outer conductors of transmission lines 70, 71 and by a folded outer conductor of transmission line 72. Transmission lines 74 and 75 are connected in series relative to load 76 with resulting characteristic impedance equal to 4Z and operate in the same manner as the transmission line 64 of FIG. 11a. The electrical length of each of these lines should also be equal to 2t.

It should be noted that combined design of FIG. 11a for t1=0 and FIG. 12a is also possible. Accordingly, in addition to the two intrinsic transmission lines 74 and 75 of FIG. 12a (with impedances more then 2Z each), the transmission line 65 of FIG. 11a with characteristic impedance more then 4Z could be used.

Figure 13A:
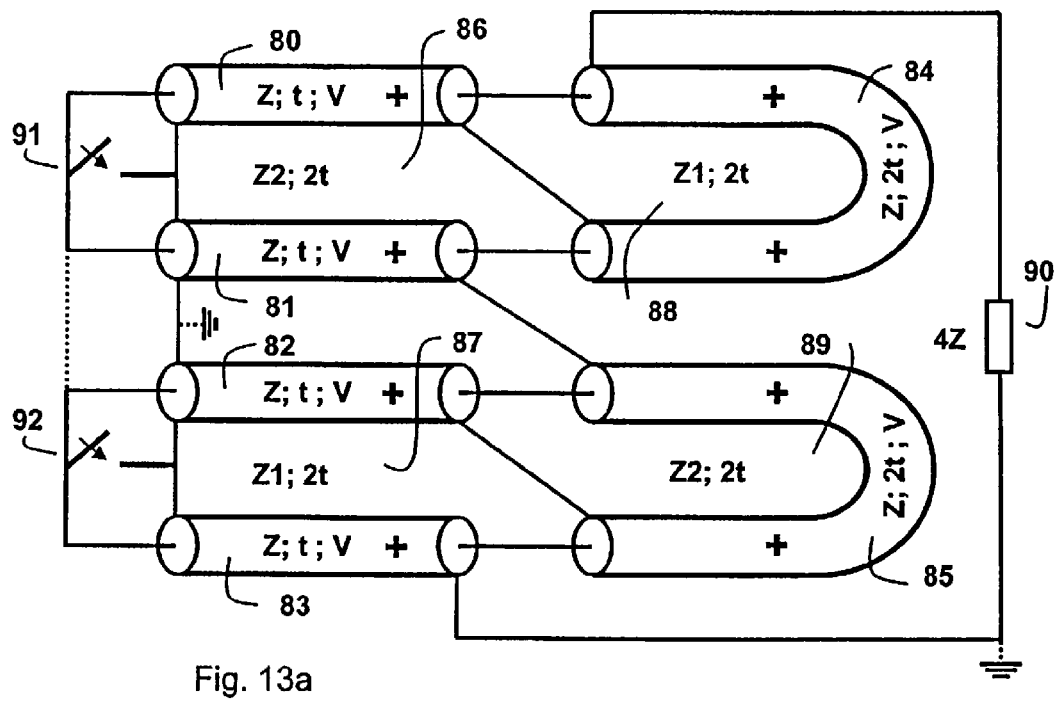
FIG. 13a depicts a schematic of two series connected double Blumlein based bipolar pulse generators with their intrinsic transmission lines according to an embodiment of the present invention.
Figure 13B:
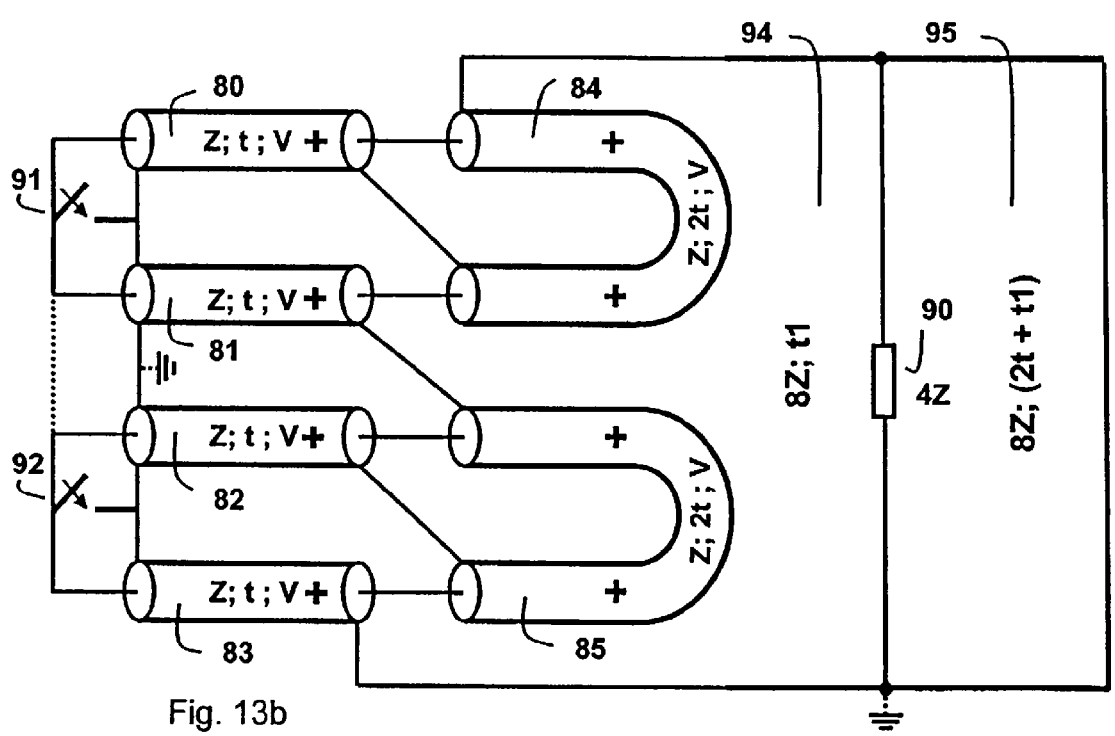
FIG. 13b depicts a schematic of two series connected double Blumlein based bipolar pulse generators in case of neglecting of intrinsic transmission lines according to an embodiment of the present invention.

FIG. 13a is a schematic of a series connected two double Blumlein based bipolar pulse generators according to an embodiment of the present invention. This generator consists of a double Blumlein-based bipolar pulse generator's structure (transmission lines 80, 81, 84, 86 and 88), which is the same as the generator on FIG. 12a and it is connected in series with exactly the same generator's structure (transmission lines 82, 83, 85, 87 and 89). Both switches 91 and 92 should be closed simultaneously. These two switches could be replaced by a single switch or by any number of simultaneously closed switches. It should be noted that intrinsic transmission lines 86, 87, 88 and 89 (if they are neglected) could be replaced by a single (or two) transmission line(s) as shown in FIG. 13b (transmission line 95 or transmission lines 94 and 95 if t1>0). In the case of two lines, transmission line 94 with time delay t1 provides an additional 2t1 separation between sub-pulses, i.e. total time separation 2(t+t1) could be implemented. Any negative effect by the intrinsic transmission lines can be minimized by proper design.

Figure 14:
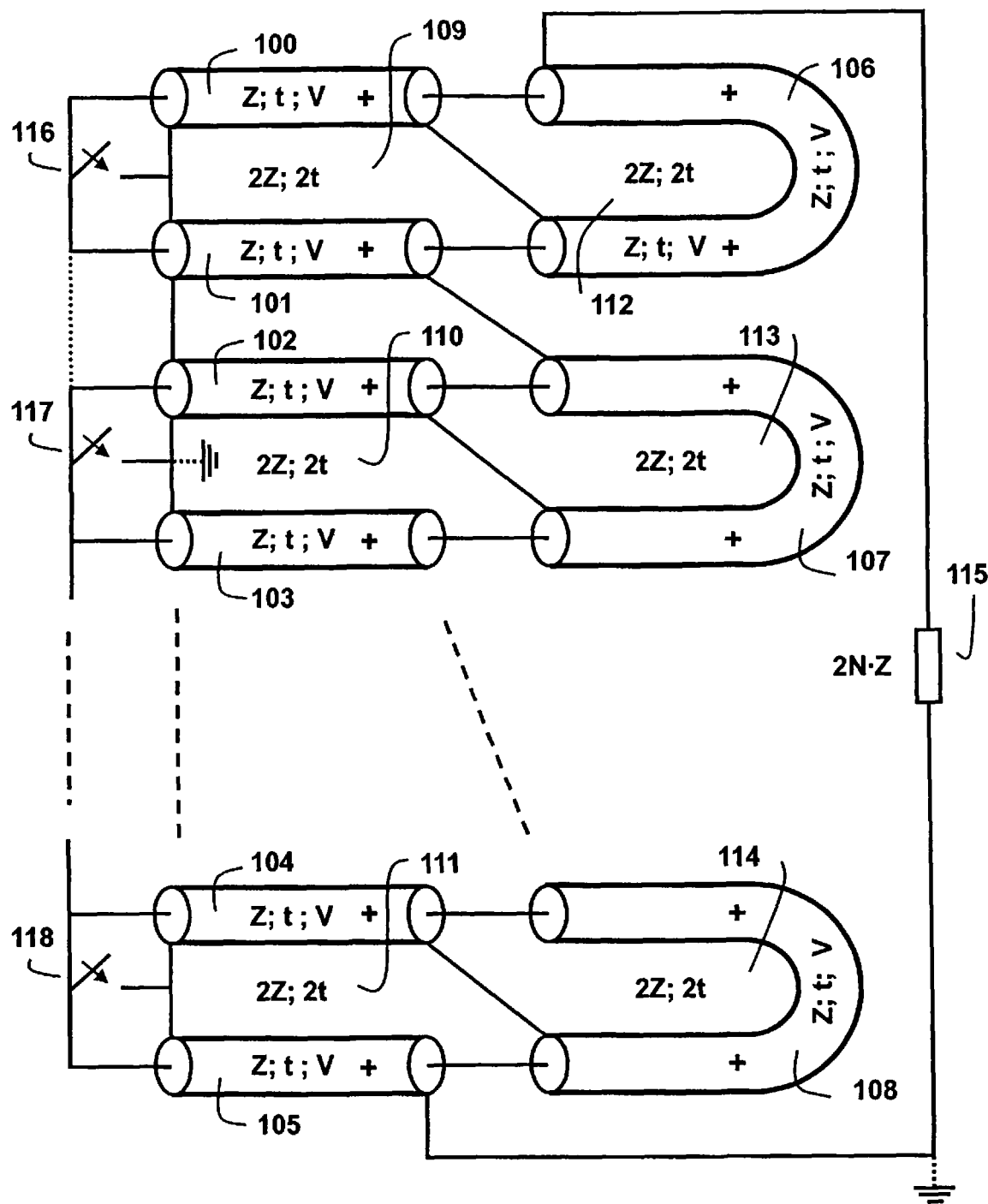
FIG. 14 depicts a schematic of a series connected N double Blumlein based bipolar pulse generators with their intrinsic transmission lines according to an embodiment of the present invention.

FIG. 14 is a schematic of series connected N double Blumlein based bipolar pulse generator according to an embodiment of the present invention. This generator consists of double Blumlein-based bipolar pulse generator structure (transmission lines 100, 101, 106, 109 and 112), which is the same as generator in FIG. 12a and is connected in series with exactly the same generator structure (transmission lines 102, 103, 107, 110 and 113). This second double Blumlein-based bipolar pulse generator structure is also connected in series with the next the same generator structure and finally with the last N-th generator structure (lines 104, 105, 108, 111 and 114). All simultaneously closed N switches 116, 117 . . . 118 could be replaced by a single switch or by any number of switches. The load 115 is a result of series connection matched loads of individual double Blumlein-based Bipolar Pulse Generators with their summarized impedance 2NZ.

By analogy with the generators shown in FIG. 13a and FIG. 13b, all of the intrinsic transmission lines 109, 110, . . . 111 and 112, 113, . . . 114 could be replaced by a single line connected to the load 115 at its near end and short-circuited at its distal end, which is similar to transmission line 95 (FIG. 13b) when t1=0. For an extended gap between sub-pulses (t1>0), an additional transmission line as transmission line 94 in FIG. 13b should be used. If various combined solutions for short-circuited at their distal end transmission line and intrinsic lines as discussed above with respect to FIGS. 11a, 12a and FIG. 13a, could be used depending on specific designs issues. It should be noted for all generators shown in FIGS. 11a, 12a, 13a and 14, various positions of ground connections can be used including single ground or no connections to ground.

FIG. 15a is a schematic of double single-stage bipolar pulse generator according to an embodiment of the present invention. By analogy with the double Blumlein-based bipolar pulse generators according to FIG. 12a, this generator is obtained by interconnection of two bipolar pulse generators. However, in this case there is no gap between positive and negative sub-pulses. Two switched transmission lines 120 and 121 are combined with a single switch 126 and a single non-switched transmission line 122 is provided with double length 2t. Two intrinsic equal-length transmission lines 123 and 124 with impedances Z2 and Z1, respectively, are provided. For this generator, no connections to ground or different ground connections, including shown on FIG. 15a, could be used. Independent on connections to ground, different combinations of characteristic impedances Z1 and Z2 without deterioration of the generating pulse are acceptable. Assuming Z=1 (normalization) some of these combinations are presented in Table 1 below.

TABLE 1

| Z1 (Z2) | 8 | 7 | 6 | 5 | 4 | 3 | 2.5 | 2 |
| Z2 (Z1) | 8 | 9.2 | 11 | 14 | 20 | 38 | 74 | ∞ |

FIG. 15b illustrates pulse shape on the load 125 independent on values Z1 and Z2. In the case when Z1 and Z2 are very high (Z1, Z2>>Z, i.e. intrinsic lines 123 and 124 are neglected), the bipolar pulse according to FIG. 15b could be achieved by using a transmission line connected to the load 125 at its near end and short-circuited at its distal end, as was shown on FIG. 11a and FIG. 13b. To provide separation between sub-pulses an extra transmission line like transmission line 64 in FIG. 11a or transmission line 94 in FIG. 13b should be used.

Referring to FIG. 16, which is a schematic of generator, which consists of two series connected double single-stage bipolar pulse generators shown on FIG. 15a as an embodiment of the present invention. This generator consists of double single-stage bipolar pulse generator structure (lines 130, 131, 134, 136 and 138), which is the same as generator structure on FIG. 15a and it is connected in series with exactly the same generator structure (transmission lines 132, 133, 135, 137 and 139). Both switches 141 and 142 should be closed simultaneously. These two switches could be replaced by a single switch or by any number of simultaneously closed switches.

Figure 17:
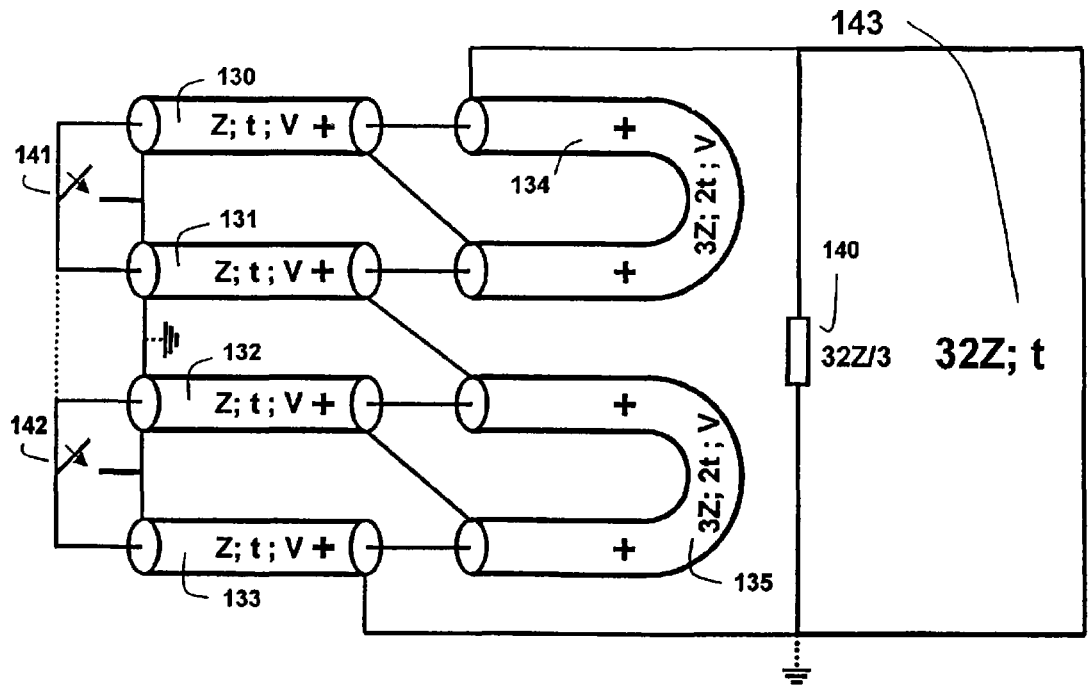
FIG. 17 depicts a schematic of series connected two single-stage, double bipolar pulse generators without (neglecting) their intrinsic transmission lines according to an embodiment of the present invention.

In the case when impedances Z1 and Z2 of intrinsic transmission lines 136, 137, 138 and 139 are much more compared to Z (and 3Z) the structure FIG. 13b is valid with specific values of load impedance 140, which should be equal to 32Z/3 as shown on FIG. 17. Characteristic impedance of transmission line 143 should be equal to 32Z and their electrical length is equal t. Separation between sub-pulses will be also equal zero.

Figure 18A:
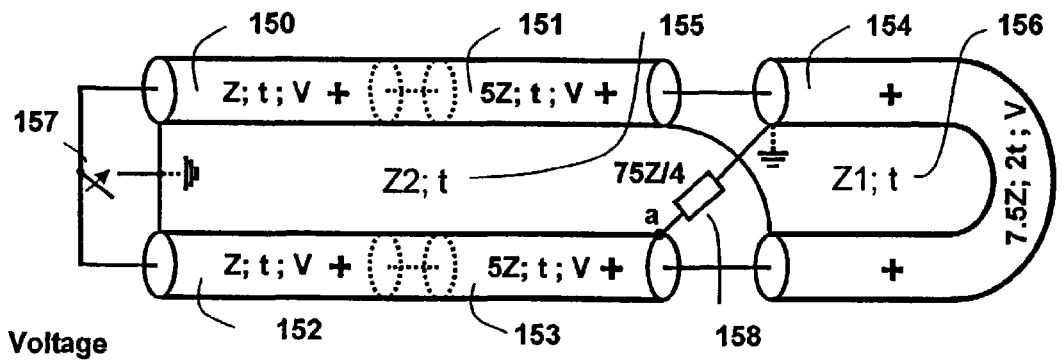
FIG. 18a depicts a schematic of two-step, double bipolar pulse generators with their intrinsic transmission lines according to an embodiment of the present invention.
Figure 18B:
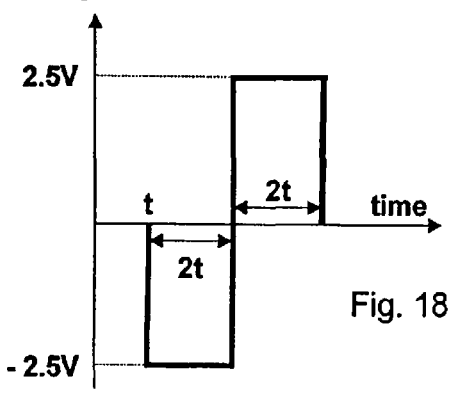

FIG. 18a is a schematic of bipolar pulse generator as an embodiment of the present invention. This generator consists of two-step, double single-stage bipolar pulse generator structure with intrinsic transmission lines that provides bipolar pulse. This generator operates, in principle, as generator according to FIG. 7a in mentioned above U.S. Patent Application 2007/0165839 A1. First step with transmission lines 150 and 152 is connected to the second step with transmission lines 151 and 153, while transmission line 154 with double electrical length 2t play the same role as two transmission lines 340 in mentioned above generator according to FIG. 7a. Intrinsic lines 155 and 156 connected in series play the same role as transmission line 385 in mentioned above generator according to FIG. 7a. FIG. 18b illustrates the pulse form on the load provided by generator according to FIG. 18a.

Figures 19, 20:
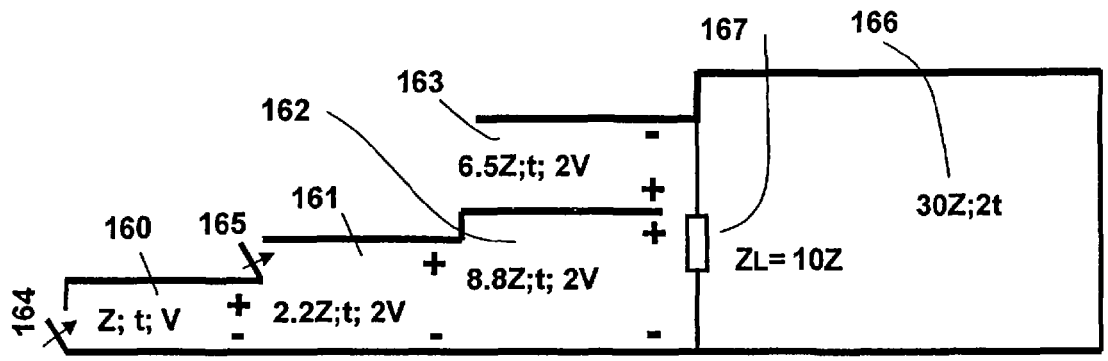
FIG. 19 depicts a schematic of three-step bipolar pulse generator with two switches in first two successive steps and with the gap between sub-pulses equal to the length of sub-pulse as an embodiment of the present invention.
FIG. 20 illustrate the table of multi-steps bipolar pulse generators with two switches in first two successive steps and with the gap between sub-pulses equal to the length of sub-pulse according to an embodiment of the present invention.

FIG. 19 is a schematic of bipolar pulse generator with two switches in first two successive steps as an embodiment of the present invention. This generator provides bipolar pulse with gap between sub-pulses equal to the length of sub-pulse. The charging voltage 2V of second and third steps is twice the charging voltage V of the first step. In this case voltages on both switches 164 and 165 are identical and equal V. Mostly because of characteristic impedance of the second step line 161 is about twice the characteristic impedance of the first step line 160 the total energy stored in this generator, i.e. in lines 160, 161, 162 and 163 is much higher compared to single-switch stepped-line generator, as well as two-switches generator according to FIG. 20 in U.S. Patent Application 2007/0165839 A1.

During operation if switch 164 is turned ON (closed) at time t0, the second switch 165 should be turned ON (closed) at time t0+t, i.e., at time slightly less than t after t0 to prevent overvoltage on switch 165. However, in the case of switch 165 is a spark-gap it will be turned ON automatically due to overvoltage. The impedance transformation (ZL/Z) as a ratio of load impedance 167 to the lowest impedance Z of the first step 160 and ratio of inductive stub 166 to the load impedance will be increased by increasing the number of steps without deterioration the pulse shape. FIG. 20 shows a table of normalized element's values for N-step (N=3, 5, 7 . . . 23) bipolar pulse generator according to FIG. 19 and illustrate the increasing transformation ratios.

Figure 21A:
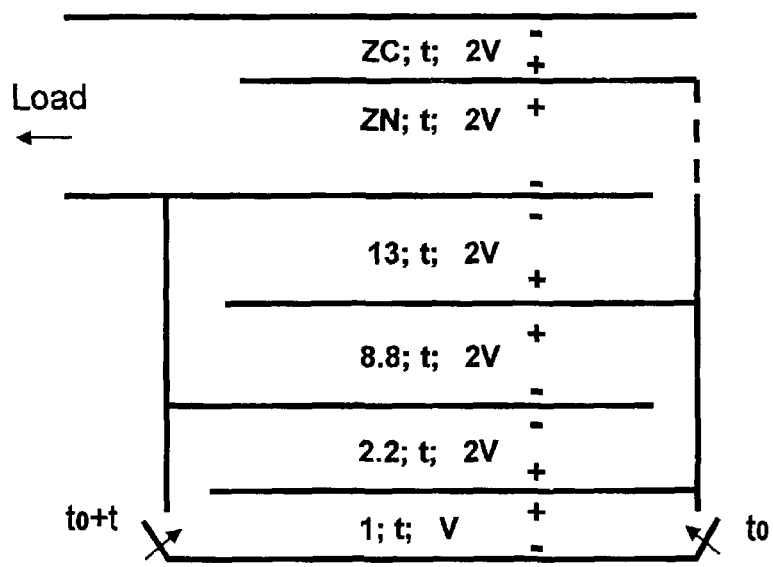
FIG. 21a depicts a totally folded design of N-step bipolar pulse generator with two switches in first two successive steps and with the gap between sub-pulses equal to the length of sub-pulse according to an embodiment of the present invention.
Figure 21B:
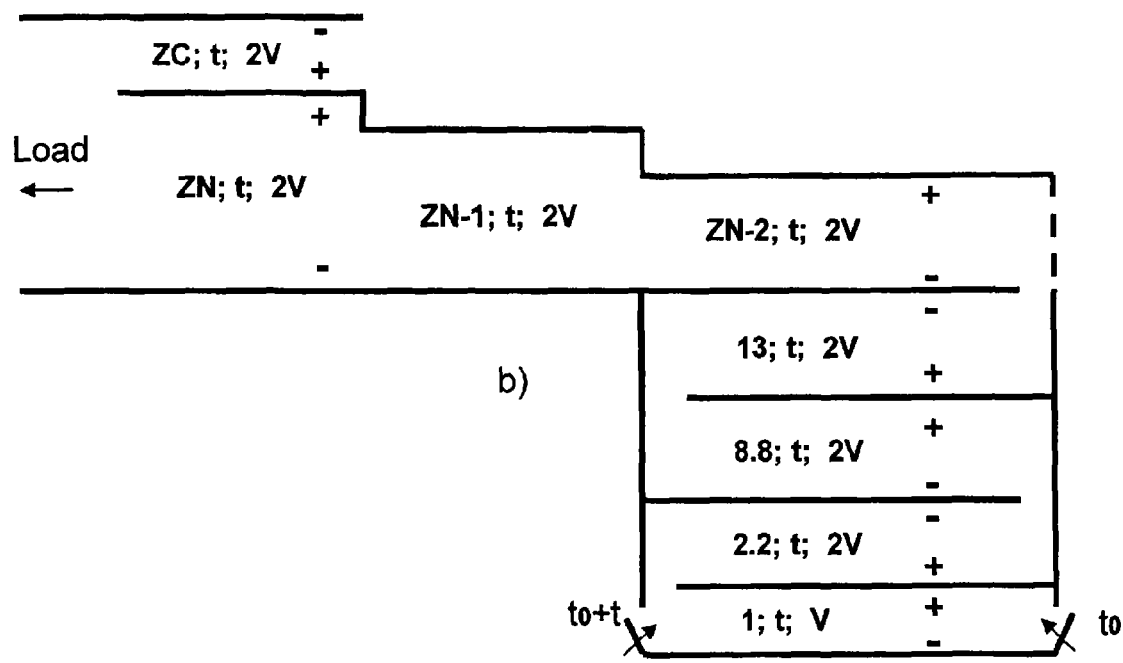
FIG. 21b depicts a partial-folded design of N-step bipolar pulse generator with two switches in first two successive steps and with the gap between sub-pulses equal to the length of sub-pulse according to an embodiment of the present invention

FIGS. 21a and 21b illustrates folded and partly folded designs of bipolar pulse generator according to FIG. 19, as an embodiment of the present invention. Both switches 164 and 165 are positioned outside structure that is preferable for practical implementation.

The invention has been described with reference to certain preferred embodiments thereof. It will be understood by those skilled in the art that modifications and variations are possible with the scope of the appended claims.

What is claimed is:

1. A bipolar pulse generator comprising:
   a stacked Blumlein charging structure including n identically first charged transmission lines with switches at their near ends, and n oppositely charged second transmission lines with the same length and characteristic impedances as for the first transmission lines;
   an addition non-charged transmission line connected at its near end to an output of the charging structure and at its distal end to a load; and
   a further transmission line connected at its near end to the load and short-circuited at its distal end;
   wherein the additional non-charged transmission line has a specified electrical length t1 and characteristic impedance equal to 2nZ0, where Z0 is a characteristic impedance of each of the first charged transmission lines and the second charged transmission lines, the load impedance is equal to nZ0, and the characteristic impedance of the further transmission line is the same as the additional non-charged transmission line.

2. A bipolar pulse generator as claimed in claim 1, wherein the electrical length of the further transmission line is equal 2t+t1, where t is an electrical length of each of the first charged transmission lines and the second charged transmission lines.

* * * * *